(12) United States Patent
Yamaguchi (10) Patent No.: US 8,847,330 B2
(45) Date of Patent: Sep. 30, 2014

(54) SEMICONDUCTOR DEVICE (71) Applicant: Renesas Electronics Corporation, Kanagawa (JP)

(72) Inventor: Toshihide Yamaguchi, Kanagawa (JP)

(73) Assignee: Renesas Electronics Corporation, Kanagawa (JP)

( * ) Notice: Subject to any disclaimer, the term of this patent is extended or adjusted under 35 U.S.C. 154(b) by 0 days.

(21) Appl. No.: 13/849,998

(22) Filed: Mar. 25, 2013

(65) Prior Publication Data

US 2013/0207164 A1    Aug. 15, 2013

Related U.S. Application Data

(63) Continuation of application No. 12/826,037, filed on Jun. 29, 2010, now Pat. No. 8,432,003.

(30) Foreign Application Priority Data

Jul. 23, 2009   (JP) ................................ 2009-172516

(51) Int. Cl.
*H01L 27/088*     (2006.01)
*H01L 27/02*      (2006.01)
*H01L 27/105*     (2006.01)
*H01L 21/8234*    (2006.01)

(52) U.S. Cl.
CPC ............ *H01L 27/105* (2013.01); *H01L 27/088* (2013.01); *H01L 27/0207* (2013.01); *H01L 21/823481* (2013.01)
USPC ..... 257/401; 257/206; 257/506; 257/E27.014

(58) Field of Classification Search
USPC ................................................ 257/206, 401
See application file for complete search history.

(56) References Cited

U.S. PATENT DOCUMENTS 6,635,935 B2   10/2003   Makino
7,093,215 B2   8/2006   Sahara et al.
(Continued)

FOREIGN PATENT DOCUMENTS

JP   2002-26125       1/2002
JP   2006-253393 A    9/2006
(Continued)

OTHER PUBLICATIONS

Japanese Official Action—2009-172516—Oct. 11, 2013.
(Continued)

*Primary Examiner* — Earl Taylor
(74) *Attorney, Agent, or Firm* — Young & Thompson (57) ABSTRACT

To suppress stress variation on a channel forming region, a semiconductor device includes an element isolating region on the semiconductor substrate principal surface, and an element forming region on the principal surface to be surrounded by the element isolating region. The principal surface has orthogonal first and second directions. A circumferential shape of the element forming region has a first side extending along the first direction. The element forming region has a first transistor region (TR1), a second transistor region (TR2) arranged between the first side and TR1, and a dummy region on the first direction side of TR1. TR1 has a first channel forming region facing the first side. TR2 has a second channel forming region facing the first side. The first channel forming region has a non-facing region that is not facing the second channel forming region. The dummy region faces the non-facing region in the second direction.

9 Claims, 4 Drawing Sheets

(56) References Cited

U.S. PATENT DOCUMENTS

| | | | |
|---|---|---|---|
| 7,205,617 B2 | 4/2007 | Ohta et al. | |
| 7,446,352 B2 | 11/2008 | Becker et al. | |
| 7,592,676 B2 * | 9/2009 | Nakanishi | 257/374 |
| 7,906,801 B2 * | 3/2011 | Becker et al. | 257/206 |
| 7,910,958 B2 * | 3/2011 | Becker et al. | 257/206 |
| 7,910,959 B2 * | 3/2011 | Becker et al. | 257/206 |
| 7,923,757 B2 * | 4/2011 | Becker et al. | 257/206 |
| 7,932,544 B2 * | 4/2011 | Becker et al. | 257/206 |
| 7,932,545 B2 * | 4/2011 | Becker et al. | 257/206 |
| 7,939,858 B2 * | 5/2011 | Nakanishi | 257/206 |
| 7,943,966 B2 * | 5/2011 | Becker et al. | 257/206 |
| 7,943,967 B2 * | 5/2011 | Becker et al. | 257/206 |
| 7,948,012 B2 * | 5/2011 | Becker et al. | 257/206 |
| 7,948,013 B2 * | 5/2011 | Becker et al. | 257/206 |
| 7,952,119 B2 * | 5/2011 | Becker et al. | 257/206 |
| 7,989,847 B2 * | 8/2011 | Becker et al. | 257/206 |
| 7,989,848 B2 * | 8/2011 | Becker et al. | 257/206 |
| 8,022,441 B2 * | 9/2011 | Becker et al. | 257/206 |
| 8,030,689 B2 * | 10/2011 | Becker et al. | 257/206 |
| 8,035,133 B2 * | 10/2011 | Becker et al. | 257/206 |
| 8,053,346 B2 * | 11/2011 | Ryu et al. | 438/587 |
| 8,058,671 B2 * | 11/2011 | Becker et al. | 257/206 |
| 8,072,003 B2 * | 12/2011 | Becker et al. | 257/206 |
| 8,089,098 B2 * | 1/2012 | Becker et al. | 257/206 |
| 8,089,099 B2 * | 1/2012 | Becker et al. | 257/206 |
| 8,089,100 B2 * | 1/2012 | Becker et al. | 257/206 |
| 8,089,101 B2 * | 1/2012 | Becker et al. | 257/206 |
| 8,089,102 B2 * | 1/2012 | Becker et al. | 257/206 |
| 8,089,103 B2 * | 1/2012 | Becker et al. | 257/206 |
| 8,089,104 B2 * | 1/2012 | Becker et al. | 257/206 |
| 8,101,975 B2 * | 1/2012 | Becker et al. | 257/206 |
| 8,110,854 B2 * | 2/2012 | Becker et al. | 257/206 |
| 8,129,750 B2 * | 3/2012 | Becker et al. | 257/206 |
| 8,129,751 B2 * | 3/2012 | Becker et al. | 257/206 |
| 8,129,752 B2 * | 3/2012 | Becker et al. | 257/206 |
| 8,129,753 B2 * | 3/2012 | Becker et al. | 257/206 |
| 8,129,754 B2 * | 3/2012 | Becker et al. | 257/206 |
| 8,129,755 B2 * | 3/2012 | Becker et al. | 257/206 |
| 8,129,756 B2 * | 3/2012 | Becker et al. | 257/206 |
| 8,129,757 B2 * | 3/2012 | Becker et al. | 257/206 |
| 8,134,183 B2 * | 3/2012 | Becker et al. | 257/206 |
| 8,134,184 B2 * | 3/2012 | Becker et al. | 257/206 |
| 8,134,185 B2 * | 3/2012 | Becker et al. | 257/206 |
| 8,134,186 B2 * | 3/2012 | Becker et al. | 257/206 |
| 8,138,525 B2 * | 3/2012 | Becker et al. | 257/206 |
| 8,217,428 B2 * | 7/2012 | Becker et al. | 257/206 |
| 8,237,203 B2 * | 8/2012 | Tsuda et al. | 257/206 |
| 8,253,172 B2 * | 8/2012 | Becker et al. | 257/206 |
| 8,253,173 B2 * | 8/2012 | Becker et al. | 257/206 |
| 8,258,547 B2 * | 9/2012 | Becker et al. | 257/206 |
| 8,258,548 B2 * | 9/2012 | Becker et al. | 257/206 |
| 8,258,549 B2 * | 9/2012 | Becker et al. | 257/206 |
| 8,258,550 B2 * | 9/2012 | Becker et al. | 257/206 |
| 8,258,551 B2 * | 9/2012 | Becker et al. | 257/206 |
| 8,258,552 B2 * | 9/2012 | Becker et al. | 257/206 |
| 2002/0003270 A1 | 1/2002 | Makino | |
| 2003/0127697 A1 | 7/2003 | Ohta et al. | |
| 2004/0153986 A1 | 8/2004 | Sahara et al. | |
| 2005/0280031 A1 | 12/2005 | Yano | |
| 2006/0259881 A1 | 11/2006 | Sahara et al. | |
| 2007/0164317 A1 * | 7/2007 | Nakanishi | 257/206 |
| 2007/0267680 A1 | 11/2007 | Uchino et al. | |
| 2008/0217704 A1 | 9/2008 | Takahashi | |
| 2008/0265335 A1 | 10/2008 | Ryu et al. | |
| 2008/0309374 A1 | 12/2008 | Kobayashi | |
| 2010/0006897 A1 | 1/2010 | Becker et al. | |
| 2010/0006898 A1 | 1/2010 | Becker et al. | |
| 2010/0006899 A1 | 1/2010 | Becker et al. | |
| 2010/0006900 A1 * | 1/2010 | Becker et al. | 257/206 |
| 2010/0025731 A1 * | 2/2010 | Becker et al. | 257/206 |
| 2010/0025732 A1 * | 2/2010 | Becker et al. | 257/206 |
| 2010/0025733 A1 * | 2/2010 | Becker et al. | 257/206 |
| 2010/0032721 A1 * | 2/2010 | Becker et al. | 257/206 |
| 2010/0032722 A1 * | 2/2010 | Becker et al. | 257/206 |
| 2010/0032723 A1 * | 2/2010 | Becker et al. | 257/206 |
| 2010/0032724 A1 * | 2/2010 | Becker et al. | 257/206 |

FOREIGN PATENT DOCUMENTS

| | | |
|---|---|---|
| JP | 2007-027272 | 2/2007 |
| JP | 2007-311491 | 11/2007 |
| JP | 2007-311587 | 11/2007 |

OTHER PUBLICATIONS

Japanese Official Action dated Feb. 28, 2014; Patent Application No. 2009-172516.

* cited by examiner

Fig. 2

SEMICONDUCTOR DEVICE

INCORPORATION BY REFERENCE

This patent application claims a priority on convention based on Japanese Patent Application No. 2009-172516. The disclosure thereof is incorporated herein by reference.

BACKGROUND OF THE INVENTION

1. Field of the Invention

The present invention relates to a semiconductor device.

2. Description of Related Art

A semiconductor device includes a semiconductor substrate, and a transistor formed on a principal surface of the semiconductor substrate. An element forming region and an element isolating region are provided on the principal surface. In the element forming region, an element such as a transistor or the like is provided. The element isolating region is provided for electrically separating the element forming region from other regions. The element isolating region is formed of an insulating material (for example, silicon oxide film or the like). The element forming region is surrounded by the element isolating region.

The element forming region includes a transistor forming region on which a transistor is provided. The transistor forming region includes a diffusion region (a source and drain region) and a channel forming region.

Generally, the element forming region and the element isolating region are formed of different materials. In this case, the channel forming region may be stressed by the element isolating region because of a difference in a rate of thermal expansion. The stress influences mobility of a carrier (an electron or hole) in the channel forming region.

As a related technique, a semiconductor integrated circuit is proposed in document 1 (Japanese patent publication JP-2007-311491A). This semiconductor integrated circuit has a CMOS circuit including a N-channel transistor and a P-channel transistor. In this semiconductor integrated circuit, one of the N-channel transistor and P-channel transistor has a gate-isolation structure, and the other has a shallow-trench-isolation structure. According to this semiconductor integrated circuit, one of the transistors is not stressed by STI, and the other is stressed by the STI to be changed in characteristics. Therefore, performance of the P-channel transistor and N-channel transistor can be efficiently improved.

The stress applied to the channel forming region by the element isolating region is depended on a distance between the channel forming region and the element isolating region. Accordingly, the mobility of carrier in the channel forming region is depended on the distance. As another related technique, in document 2 (Japanese patent publication JP-2007-27272), it is described that a drain current Idr is depended on a Gate-STI (X) that is a distance between a channel region and a STI region.

SUMMARY

Figure 1:
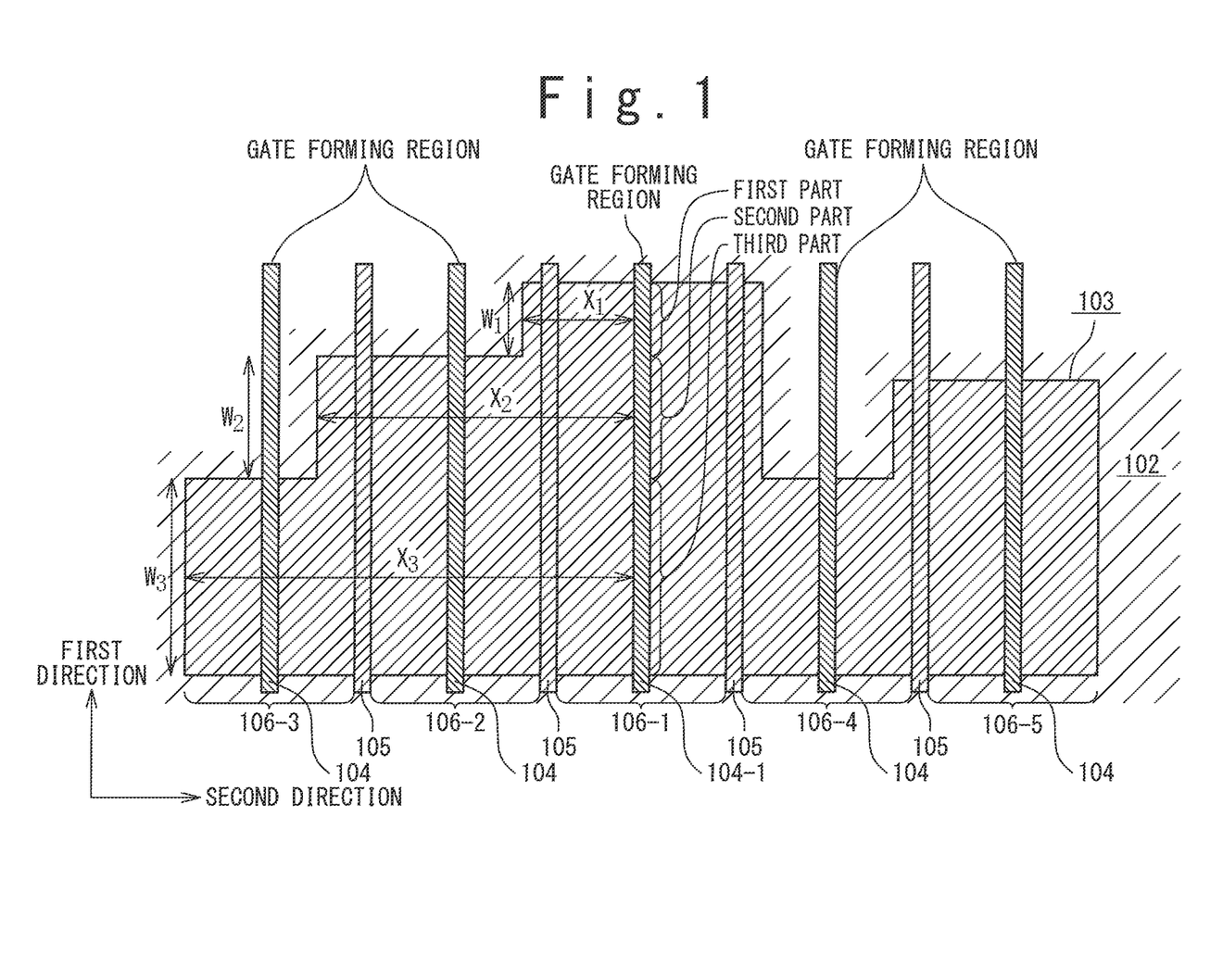
FIG. 1 is a layout diagram showing an example of an element forming region.

By the way, in the element forming region, a plurality of transistor forming regions may be provided. Additionally, the plurality of transistor forming regions may be different from each other in the channel width. FIG. 1 is a layout diagram showing such element forming region.

In FIG. 1, a first direction and a second direction are defined on a principal surface of the semiconductor substrate. The first direction and the second direction are orthogonal to each other. The element forming region 103 is surrounded by the element isolating region 102. In the element forming region 103, a plurality (five in FIG. 1) of transistor forming regions 106 are provided along the second direction. A dummy gate forming region 105 are provided between adjacent two transistor forming regions 106. On the dummy gate forming region 105, a dummy gate is provided. A voltage is applied to the dummy gate such that the dummy gate forming region 105 is inactive. The adjacent two transistor forming regions 106 are electrically divided by the dummy gate forming region 105.

On the semiconductor substrate, a plurality of gate forming region are provided correspondingly to the plurality of transistor forming regions 106. In each gate forming region, a gate electrode is formed on the substrate. The each gate forming region extends along the first direction. In the transistor forming region 106, a channel is formed in a position corresponding to the gate forming region. The region in which the channel is formed is referred to as a channel forming region 104.

Here, the plurality of transistor forming regions 106 are different from each other in a width along the first direction. As the result, the widths of the channel forming regions 104 (channel widths) are different from each other.

When the layout described above is employed, in one channel forming region 104, the distance from the element isolating region 102 along the second direction is uneven in a channel width direction (the first direction). As an example, the channel forming region 104-1 is focused which is provided in the transistor forming region 106-1. The channel forming region 104-1 includes, a first part whose distance from the element isolating region 102 is X1, a second part whose distance is X2, and a third part whose distance is X3. Among the first part, the second part, and the third part, the stress applied by the element isolating region 102 is different from each other.

As shown in FIG. 1, the length of the first part along the first direction is noted as W1. The length of the second part along the first direction is noted as W2. The length of the third part along the first direction is noted as W3. Referring to "Chapter.13 of BSIM4.4.0 MOSFET MODEL—User's Manual", a drain current of the transistor provided on the transistor forming region 103 is determined by a mobility coefficient that is expressed by the following equation 1.

(Equation 1)

$$\frac{W1}{W1+W2+W3} \times \frac{1}{X1} + \frac{W2}{W1+W2+W3} \times \frac{1}{X2} + \frac{W3}{W1+W2+W3} \times \frac{1}{X3} \quad (1)$$

In the equation 1, the stress applied to the transistor forming region from only one side is taken into consideration.

When the applied stress is uneven in the channel width direction, there is a problem that the characteristics of the transistor are deteriorated.

The semiconductor device according to the present invention includes, an element isolating region provided on a principal surface of a semiconductor substrate, and an element forming region provided on the principal surface to be surrounded by the element isolating region. A first direction and a second direction are defined to be orthogonal to each other in the principal surface. An outer circumference shape of the element forming region has a first side extending along the first direction. The element forming region includes, a first transistor region, a second transistor region provided between the first side and the first transistor region, and a dummy region arranged on a side of the second transistor in the first direction. The first transistor region includes a first channel forming region that extends to face to the first side. The second transistor region includes a second channel forming region that extends to face to the first side. The first channel region includes non-facing region that does not face to the second channel region. The dummy region faces to the non-facing region in the second direction.

According to the present invention, since the dummy region is provided, the distance between the first transistor forming region and the element isolating region can be even in the channel widths direction (the first direction). As the result, the stress applied to the first transistor forming region by the element isolating region can be even in the channel width direction. With the evenness of the stress, the characteristics of the transistor provided on the first transistor forming region can be improved.

According to the present invention, a semiconductor device is provided in which the characteristics of the transistor are improved, even though the widths of the channel forming regions are uneven among the plurality of transistor regions.

BRIEF DESCRIPTION OF DRAWINGS

The above and other objects, advantages and features of the present invention will be more apparent from the following description of certain preferred embodiments taken in conjunction with the accompanying drawings, in which.

DESCRIPTION OF THE PREFERRED EMBODIMENTS

With reference to the attached drawings, the embodiments of the present invention will be described below.
(First Embodiment)

Figure 2:
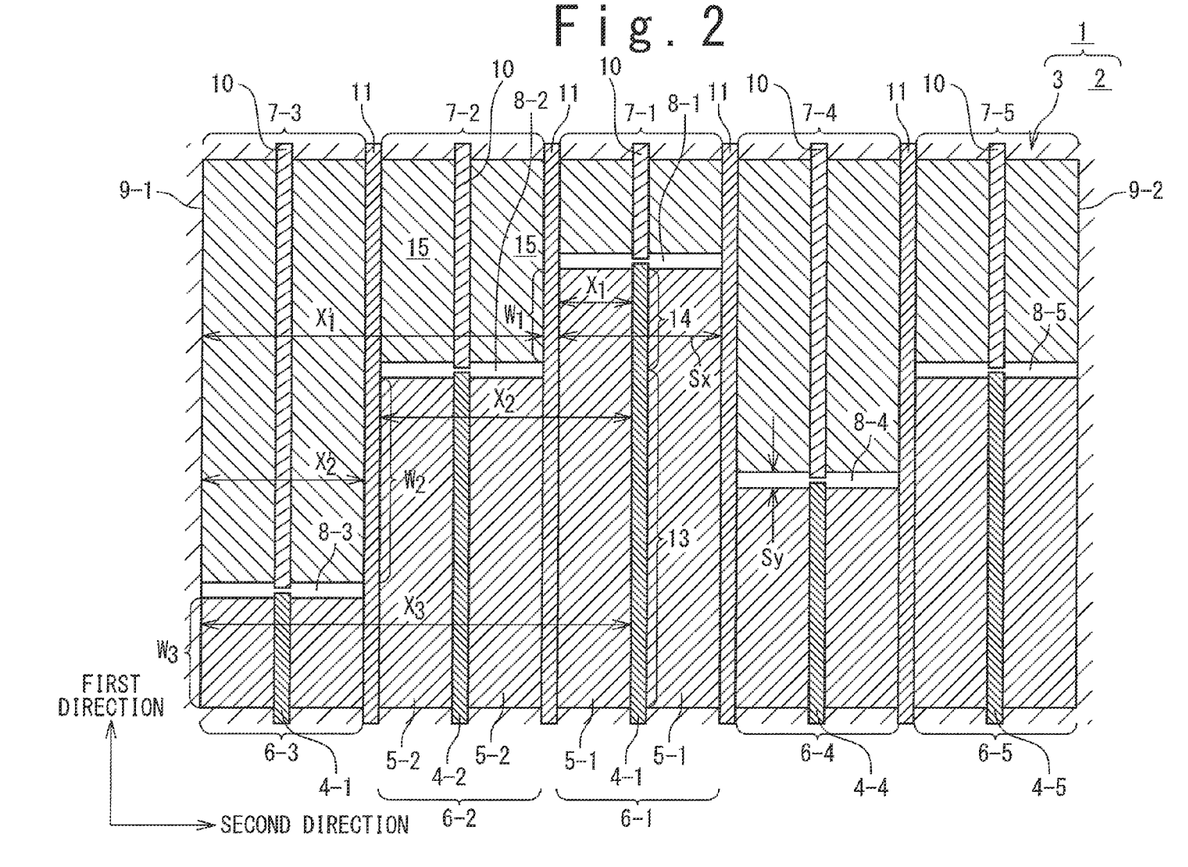
FIG. 2 is a diagram showing a pattern layout of a semiconductor device according to the first embodiment.

FIG. 2 is a diagram showing a semiconductor device according to the present embodiment. A pattern shown in FIG. 2 is provided on a principal surface of a semiconductor substrate.

As shown in FIG. 2, a first direction (gate width direction) and a second direction (gate length direction) are defined on the principal surface. The first direction and the second direction are orthogonal to each other. The semiconductor device includes an element forming region 3 and an element isolating region 2 which are provided on the principal surface.

The element forming region 3 is a region on which an element such as transistor or the like is provided. The element forming region 3 has a rectangular shape. An outer circumference shape of the element forming region 3 has two sides (9-1, 9-2), each of which extends along the first direction.

The element isolating region 2 is provided for separating the element forming region 3 from the other regions. In the element isolating region 2, an insulating material such as silicon oxide film is embedded on the principal surface of the semiconductor substrate.

The element forming region 3 will be described below in details.

The element forming region 3 includes a plurality of transistor regions 6 (6-1 to 6-5), separation regions 8(8-1 to 8-5), first dummy gate forming regions 10 and second dummy gate forming regions 11. The element forming region 3 is formed of a semiconductor material (for example, silicon film), except for the separation regions 8. The separation regions 8 are formed of a material same as the element isolating region 2 (for example, a silicon oxide film).

Each of the plurality of transistor regions 6 is a region on which a transistor is provided. The plurality of transistor regions 6 are arranged along the second direction. The each transistor region 6 has two diffusion regions 5, and a channel forming region 4(4-1 to 4-5). The channel forming region 4 extends along the first direction. The channel forming region 4 faces to the side 9-1 and 9-2. In the each transistor region 6, two diffusion regions 5 are separated by the channel forming region 4. At the channel forming region 4, a gate electrode is formed on the principal surface of the semiconductor substrate.

In the semiconductor device according to the present embodiment, among the plurality of the transistor regions 6, the lengths of the channel forming regions 4 along the first direction are different from each other. Between adjacent two transistor regions 6, one edge of the diffusion regions 5 included in the transistor regions 6 are aligned. Namely, between the plurality of the transistor regions 6, the channel widths are different. As the result, at least one of the plurality of the transistor regions 6 has a part that is not faced to the other transistor region 6 (non-facing part). As an example, the transistor region 6-1 will be focused. The channel forming region 4-1 included in the transistor region 6-1 is longer than the channel forming region 4-2 included in the transistor region 6-2. Therefore, the channel forming region 4-1 has a region facing to the channel forming region 4-2 (facing region 13) and a region not facing to the channel forming region 4-2 (non-facing region 14).

The dummy region 7(7-1 to 7-5) is provided for adjusting a distance between the channel forming region 4 and the element isolating region 2. The dummy region 7 is formed by a material same as the each transistor region 6 (for example, a silicon film).

The dummy region 7 is arranged on a side of the each transistor region 6 in the first direction. At least a part of the dummy region 7 faces to the non-facing region included in the channel forming region 4. In order to specifically explain this point, the dummy region 7-2 is focused, which is arranged on the side of the transistor region 6-2. The transistor region 6-1 is defined as a first transistor region 6-1. The side 9-1 is defined as a first side 9-1. The transistor region 6 that is provided between the first transistor region 6-1 and the first side 9-1 is defined as a second transistor region. Between the first transistor region 6-1 and the first side 9-1, the transistor region 6-2 and the transistor region 6-3 are provided. Temporally, the transistor region 6-2 is defined as a second transistor region 6-2. The dummy region 7-2 is provided on the side of the second transistor region 6-2 along the first direction. At least a part of the dummy region 7-2 faces to the non-facing region 14 provided in the first transistor region 6-1.

The same can be said when the transistor region 6-3 is defined as the second transistor region. Namely, the dummy region 7-3 is arranged on the side of the transistor region 6-3 (the second transistor region). At least a part of the dummy region 7-3 faces to a part of the first transistor region 6-1 which does not face to the transistor region 6-3.

A relationship between the first transistor region, the second transistor region, and the dummy region 7 is similarly established when another transistor region is defined as the first transistor region. Also, the relationship is established when the side 9-2 is defined as the first side.

That is to say, the dummy region 7 is provided such that the element forming region 3 has a rectangular shape that is formed by the side 9-1 and the side 9-2.

The first dummy gate forming region 10 is provided for controlling the dummy region 7 to be inactive. The first dummy gate forming region 10 extends along the first direction. The first dummy gate forming region 10 is provided on an extended line of the channel forming region 4. The first dummy gate forming region 10 divides the dummy region 7 into two dummy diffusion regions 15. A first dummy gate is formed on the first dummy gate forming region 10. A voltage is applied to the first dummy gate such that the first dummy gate forming region 10 is inactive. For example, when a transistor of N-channel type is formed on the dummy region 7, the ground voltage is applied to the first dummy gate and two dummy diffusion regions 15.

The second dummy gate forming region 11 extends along the first direction and separates the adjacent two transistor regions 16. The second dummy gate forming region 11 is a region on which the second dummy gate is provided. A power supply voltage or the ground voltage is applied to the second dummy gate such that the second dummy gate forming region is inactive. Accordingly, on the principal surface, adjacent two transistor regions 6 are electrically separated. Also, the second dummy gate forming region 11 separates the dummy region 7 from the transistor region 6 in the second direction.

The separation region 8 is provided for separating the dummy region 7 from the transistor region 7 in the first direction. The separation region 8 extends along the second direction. The separation region 8 has an insulation property and is formed of a material same as that of the element isolating region 2. The width of the separation region 8 along the first direction is a constant.

Next, a function of the semiconductor device 1 according to the present embodiment will be described. According to the present embodiment, with providing the dummy region 7, the distance between the channel forming region 4 and the element isolating region 2 can be even in the channel width direction. As a result, the stress applied to the channel forming region 4 can be even, except for the separation region 8. Therefore, the characteristics of the transistor formed in the transistor region 6 can be prevented from being deteriorated.

When the transistor region 6-1 is focused, the mobility coefficient of carrier in the channel forming region 4-1 is expressed as following equation 2. In the following equation 2, only the stress applied to the channel forming region 4-1 from the side 9-1 is taken into consideration.

(Equation 2)

$$\frac{W1}{W1+W2+W3} \times \frac{1}{X1} + \\ \frac{W2}{W1+W2+W3} \times \frac{1}{X2} + \frac{W3}{W1+W2+W3} \times \frac{1}{X3} + \\ \frac{W1-Sy}{W1+W2+W3} \times \frac{1}{X1'} + \frac{W2-Sy}{W1+W2+W3} \times \frac{1}{X2'}$$
(2)

In the equation 2, a distance between the separation region 8-1 and the separation region 8-2 is noted as W1. A distance between the separation region 8-2 and the separation region 8-3 is noted as W2. A length of the channel forming region along the first direction is noted as W3. A distance between the channel forming region 4-1 and the second dummy gate forming region 11 that is provided between the transistor forming region 6-1 and the transistor forming region 6-2 is noted as X1. A distance between the channel forming region 4-1 and the second dummy gate forming region 11 that is provided between the transistor forming region 6-2 and the transistor forming region 6-3 is noted as X2. A distance between the channel forming region 4-1 and the side 9-1 is noted as X3. A distance between the side 9-1 and the second dummy gate forming region 11 is noted as X1'. A length of the separation region 8 along the second direction is noted as Sx. A width of the separation region 8 along the first direction is noted as Sy.

As expressed by the equation 2, in the semiconductor device according to the present invention, the mobility coefficient of the channel forming region 4-1 is close to the mobility coefficient in a case where the distance between the channel forming region 4-1 and the side 9-1 is even. That is to say, the deterioration in the characteristics of the transistor can be suppressed.

In the present embodiment, an example was described in which the first dummy gate is separated from the gate electrode that is formed on the channel forming region 4. However, the first dummy gate is not necessary to be separated from the gate electrode, and may be linked to the gate electrode. Specially, in the present embodiment, since the dummy diffusion regions are divided by the second dummy gate, there is no problem in linking of the first dummy gate and the gate electrode. However, when the first dummy gate is separated from the gate electrode, the gate electrode and the first dummy gate can be controlled by different voltages, and an electric separation by the first dummy gate forming region can be absolutely carried out. Furthermore, gate capacitance of the first dummy gate is not added to that of the gate electrode. Accordingly, the first dummy gate and the gate electrode are preferably separated.

(Second Embodiment)

Subsequently, the second embodiment will be described.

Figure 3:
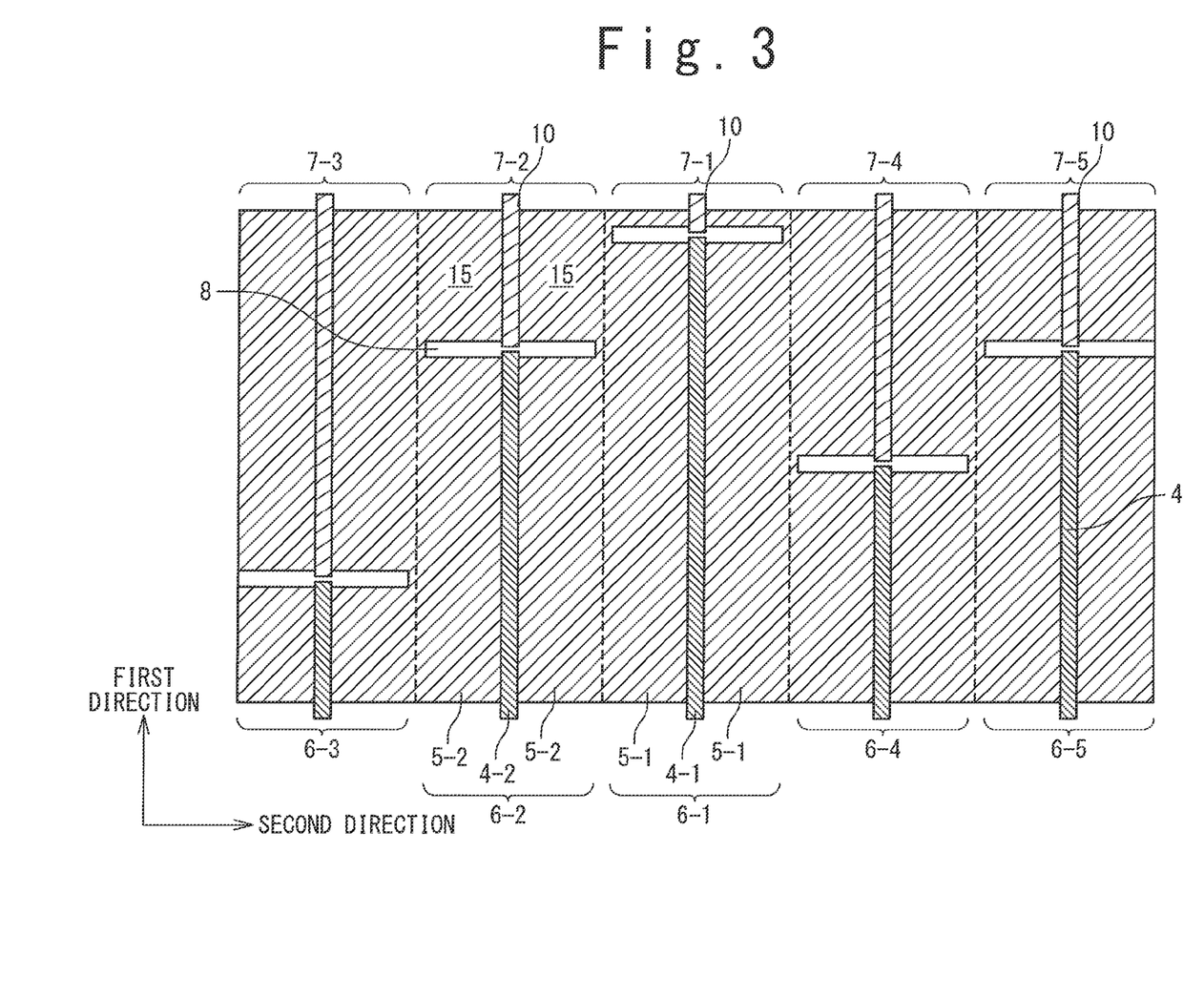
FIG. 3 is a diagram showing a pattern layout of a semiconductor device according to the second embodiment.

FIG. 3 is a diagram showing a pattern layout of the semiconductor device according to the present embodiment. In the present embodiment, the second dummy gate forming region 11 is not provided. Since the other points can be same as those in the first embodiment, detailed descriptions will be omitted.

In the present embodiment, diffusion regions 5 are not divided between adjacent two transistor regions 6. Namely, diffusion regions 5 are linked each other to be same potential between adjacent two transistor regions 6. In FIG. 3, a dotline is illustrated between adjacent two transistor regions 6 for reasons of expediency. However, in fact, there is no configuration that separates diffusion regions 5 between adjacent two transistor regions 6.

The each diffusion region 5-1 in the transistor region 6-1 is electrically connected to the diffusion region 15 included in the dummy region 7(7-1 to 7-5), because the second dummy gate forming region 11 is not provided. However, the first dummy gate forming region 10 is provided in the dummy region 7. Therefore, two diffusion regions 5-1 included in the transistor region 6-1 are not shorted via the dummy region 7.

Even if the configuration shown in the present embodiment is employed, similarly to the first embodiment, the stress applied to the channel forming region 4 can be even, and the deterioration of the transistor characteristics can be suppressed.

Furthermore, it is considerable that a metal line is provided for electrically connecting the diffusion regions 5 between adjacent two transistor regions 6. However, in this case, parasitic resistance and capacitance of the metal line may influence to an operation characteristics of the transistor. On the other hand, in the present embodiment, the diffusion regions 5 are linked between adjacent two transistor regions 6. Therefore, the parasitic resistance and capacitance generated between adjacent two transistor regions 6 can be decreased.

In the present embodiment, as the first embodiment, the first dummy gate and a gate electrode formed on the channel forming region may be linked or separated.

(Third Embodiment)

Next, the third embodiment will be described.

Figure 4:
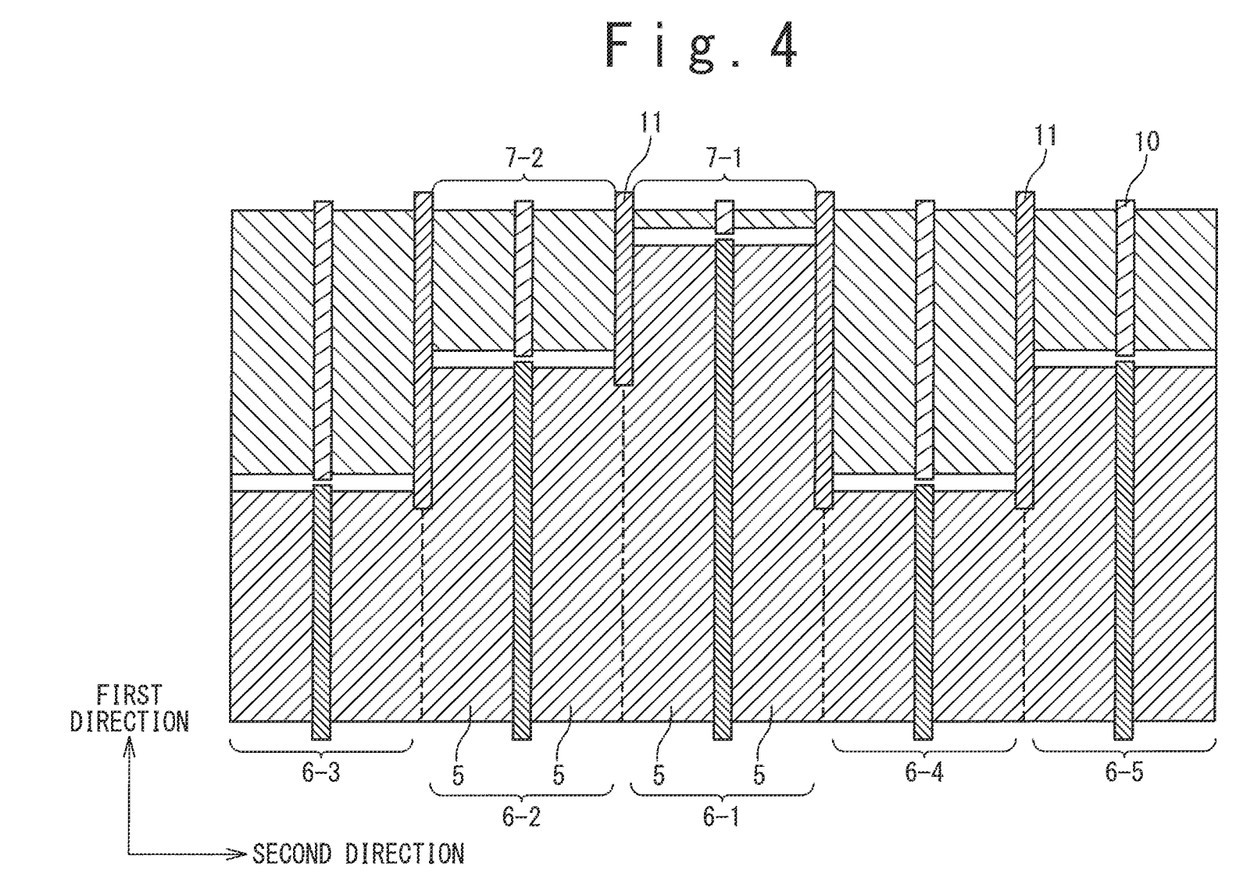
FIG. 4 is a diagram showing a pattern layout of a semiconductor device according to the third embodiment.

FIG. 4 is a diagram showing a pattern layout of the semiconductor device according to the present embodiment. In the present embodiment, the second dummy gate forming region 11 is changed from that of the first embodiment. Since the other points can be same as those in the first embodiment, details will be omitted.

As shown in FIG. 4, the second dummy gate forming region 11 extends such that the dummy region 7 and the each transistor region 6 are separated in the second direction. However, the second dummy gate forming region 11 is not provided between adjacent two transistor regions 6. Accordingly, between adjacent two transistor regions 6, diffusion regions 5 are connected to be same voltage. That is, as the second embodiment, diffusion regions 5 are linked to be same voltage between adjacent two transistor regions 6.

When a configuration shown in the present embodiment is employed, as the embodiments mentioned above, since the stress applied to the channel forming region 4 can be even, the characteristics deterioration of the transistor can be suppressed.

Furthermore, in the present embodiment, the transistor region 6 and the dummy region 7 are separated by the second dummy gate forming region 11. A leaking of a current flowing between sauce and drain (two diffusion regions 5) can be absolutely prevented.

In the present embodiment, as the first embodiment, the first dummy gate and the gate electrode formed on the channel forming region may be linked or separated.

As mentioned above, the present invention has been described by illustrating the first to third embodiments. These embodiments are not independent, and it is possible to employ a combination of these embodiments within a compatible range.

What is claimed is:

1. A semiconductor device comprising:
   a semiconductor substrate, wherein on the substrate is an element forming region surrounded by an element isolating region separating the element forming region from other regions, the element forming region including:
   a first transistor having a first gate forming region between first diffusion layers, said first gate forming region extending in a first direction which is a gate width direction;
   a second transistor arranged adjacent to said first transistor in said first direction, said second transistor having a second gate forming region between second diffusion layers, said second gate forming region extending in said first direction to be arranged in plan-view straight-line alignment with said first gate forming region;
   a first separation region arranged between said first transistor and said second transistor, wherein in said plan view, said first diffusion layers are discrete from and spaced apart from said second diffusion layers by said first separation region, and said first gate forming region is discrete from and spaced apart from said second gate forming region by said first separation region;
   a third transistor arranged adjacent to said first transistor in a second direction which is perpendicular to said first direction, and said third transistor having a third gate forming region between third diffusion layers, said third gate forming region extending in said first direction;
   a fourth transistor arranged adjacent to said third transistor in said first direction, and said fourth transistor having a fourth gate forming region between fourth diffusion layers, said fourth gate forming region extending in said first direction to be arranged in plan-view straight-line alignment with said third gate forming region; and
   a second separation region arranged between said third transistor and said fourth transistor, wherein in said plan view, said third diffusion layers are discrete from and spaced apart from said fourth diffusion layers by said second separation region, and said third gate forming region is discrete from and spaced apart from said fourth gate forming region by said first separation region;
   wherein i) a sum of a length of said first diffusion layer in said first direction, a length of said second diffusion layers in said first direction and a length of said first separation region in said first direction is equal to ii) a sum of a length of said third diffusion layers in said first direction, a length of said fourth diffusion layers in said first direction and a length of said second separation region in said first direction; and
   a first dummy gate forming region extending in said first direction between said first diffusion layers and said third diffusion layers, with said first dummy gate forming region further extending in said first direction from an end of said first diffusion layers along and past an end part of said first separation region and between said second diffusion layers and said fourth diffusion layers to at least partially space said second diffusion layers apart from said fourth diffusion layers.

2. The semiconductor device according to claim 1, wherein said second and fourth gate forming regions are dummy gate forming regions, and a predetermined voltage applied to said second and fourth gate forming regions makes said second and fourth forming regions inactive.

3. The semiconductor device according to claim 2, wherein said predetermined voltage is a power supply voltage or ground.

4. The semiconductor device according to claim 1, wherein said length of said first diffusion layers in said first direction is different from said length of said third diffusion layers in said first direction.

5. The semiconductor device according to claim 1, wherein an edge of said first diffusion layers and an edge of said third diffusion layers are aligned in said first direction.

6. The semiconductor device according to claim 1, wherein said first diffusion layers and said third diffusion layers are continuous, and said second diffusion layers and said fourth diffusion layers are continuous.

7. The semiconductor device according to claim 1, wherein said first dummy gate forming region further extends in said first direction between said second diffusion layers and said fourth diffusion layers to completely space said second diffusion layers apart from said fourth diffusion layers.

8. The semiconductor device according to claim 1, wherein,
   a width of said first diffusion layers in said first direction is different from a width of said second diffusion layers in said first direction.

9. The semiconductor device according to claim 8, wherein,
    a width of said third diffusion layers in said first direction is different from a width of said fourth diffusion layers in said first direction.

\* \* \* \* \*